United States Patent [19]
Choi et al.

[11] Patent Number: 6,166,945
[45] Date of Patent: Dec. 26, 2000

[54] METHOD FOR CONTROLLING MEMORY CELL HAVING LONG REFRESH INTERVAL

[75] Inventors: Kyun-Kyu Choi; Yong-Weon Jeon, both of Seoul, Rep. of Korea

[73] Assignee: LG Semicon Co., Ltd., Choongcheongbuk-do, Rep. of Korea

[21] Appl. No.: 09/060,298

[22] Filed: Apr. 15, 1998

[30]   Foreign Application Priority Data

Aug. 5, 1997   [KR]   Rep. of Korea ..................... 97/37396

[51] Int. Cl.$^7$ ................................................. G11C 11/24
[52] U.S. Cl. ........................................... 365/149; 365/145
[58] Field of Search ...................................... 365/149, 145

[56]   References Cited

U.S. PATENT DOCUMENTS

| | | | |
|---|---|---|---|
| 5,262,988 | 11/1993 | Ochii | 365/222 |
| 5,426,604 | 6/1995 | Ootwaki et al. | 365/149 |
| 5,430,672 | 7/1995 | Kuwabara et al. | 365/149 |

*Primary Examiner*—David Nelms
*Assistant Examiner*—M. Tran

[57]   ABSTRACT

A method for controlling a memory cell capable of extending a refresh interval and lengthening a storing time of a cell data by raising a data of a high level voltage stored in the cell capacitor above Vdd, thereby reducing power consumption.

6 Claims, 3 Drawing Sheets

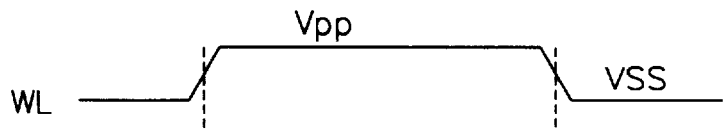
FIG. 2A CONVENTIONAL ART
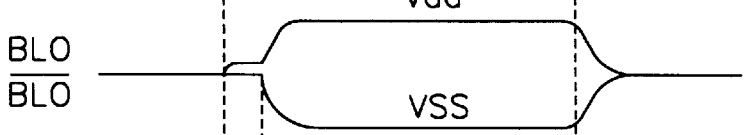
FIG. 2B CONVENTIONAL ART
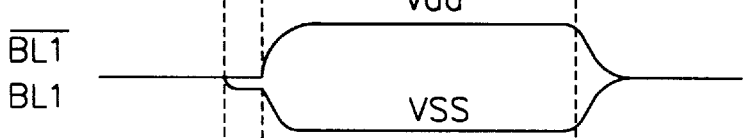
FIG. 2C CONVENTIONAL ART
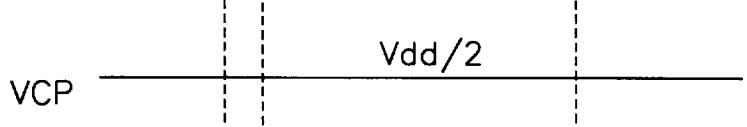
FIG. 2D CONVENTIONAL ART
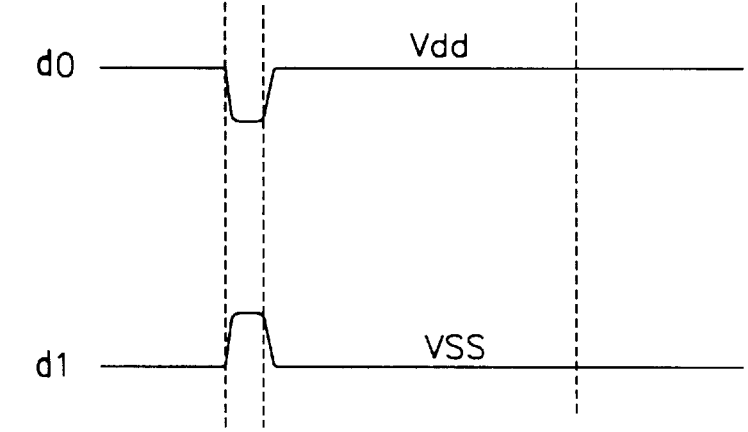
FIG. 2E CONVENTIONAL ART
FIG. 2F CONVENTIONAL ART

METHOD FOR CONTROLLING MEMORY CELL HAVING LONG REFRESH INTERVAL

BACKGROUND OF THE INVENTION

1. Field of the Invention

The present invention relates to a cell construction of a semiconductor memory device, and in particular to an improved method for controlling the semiconductor memory device capable of extending a refresh interval by lengthening a storing time of a cell data in a cell capacitor.

2. Description of the Conventional Art

FIG. 1 is a diagram illustrating the construction of a conventional memory device. As shown therein, the conventional memory device includes memory cells 1 and 2, each located in a point where a word line WL and a bit line BL cross each other, having each of NMOS transistors NM0 and NM1, and cell capacitors C0 and C1, and a sense amplifier 3 connected to each pair of bit lines BL0,/BL0 and BL1,/BL1, thereby sensing a data.

Here, in the above memory cells 1 and 2, each gate and drain of the NMOS transistors NM0 and NM1 are connected to the word line WL and the bit line BL, respectively, and each electrode of the cell capacitors C0 and C1 is connected to each source of the NMOS transistors NM0 and NM1, respectively, and the other electrode thereof is connected to an input terminal of a cell plate voltage Vcp.

The construction of the conventional memory cell will now be described in detail.

First, supposing that high and low level data are stored in the cell capacitors C0 and C1, respectively, and the data is continuously written by the refresh operation, here, the bit line pairs BL0,/BL0 and BL1,/BL1 are precharged at a Vdd/2 level and receive the cell plate voltage Vcp of the Vdd/2 level.

As shown in FIG. 2A, when the word line WL is enabled, and NMOS transistors NM0 and NM1 of the memory cells 1 and 2 are turned on, a voltage difference is each formed between the bit lines BL0 and /BL0, and the bit lines BL1 and /BL1 by charge sharing, and the voltage difference is amplified by the sense amplifier 3, thus the high and low level data become Vdd and Vss, respectively.

Accordingly, as shown in FIGS. 2B and 2C, the bit lines BL0 and BL1 become Vdd and Vss, respectively, by the sensing operation of the sense amplifier 3.

Here, since the NMOS transistors NM0 and NM1 of the memory cells 1 and 2 are being turned on, as shown in FIG. 2E and 2F, the electrodes d0 and d1 of the cell capacitors C0 and C1 also become Vdd and Vss, respectively.

Next, if the word line WL is disabled, the cell capacitors C0 and C1 become Vdd and Vss, respectively, and the high and low level data are again stored in the cell capacitors C0 and C1, respectively.

However, the data stored in each of the cell capacitors C0 and C1 is externally dissipated in leakage current. Thus, a DRAM generally performs the refresh operation of reading and again writing the data from the cell capacitors C0 and C1, before the data is completely dissipated.

Accordingly, since the data stored in the cell capacitors C0 and C1 are dissipated in leakage current, the construction of the conventional memory cell generally may have a short refresh interval, thereby increasing power consumption.

SUMMARY OF THE INVENTION

Accordingly, it is an object of the present invention to provide a method for controlling a memory cell capable of extending a refresh interval and reducing power consumption by raising a high level data above Vdd and lengthening a storing time of a cell data in a cell capacitor.

To achieve the above objects, in a memory cell construction comprising a plurality of memory cells each having a NMOS transistor of which a gate and a drain are connected to a word line and a bit line, respectively, and a cell capacitor of which an electrode is connected to a source of the NMOS transistor and the other electrode is connected to an input terminal of a cell plate voltage, and a sense amplifier connected to a pair of bit lines for amplifying a data, there is provided a method for controlling a memory cell, comprising maintaining a voltage of the cell capacitor at a Vdd level, same as the bit line, in accordance with a word line signal of a Vpp level and the cell plate voltage of V1, then maintaining the voltage of the cell capacitor at a Vdd level in accordance with the cell plate voltage of a Vss level and a word line signal of a Vdd level, and raising the voltage level of the cell capacitor up to Vdd+$\Delta$V in accordance with the word line signal of the Vdd level and the cell plate voltage of V1.

Additional advantages, objects and features of the invention will become more apparent from the description which follows.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIGS. 2A–2F are timing diagrams illustrating an input and output of each unit of FIG. 1.

DETAILED DESCRIPTION OF THE INVENTION

Figure 1:
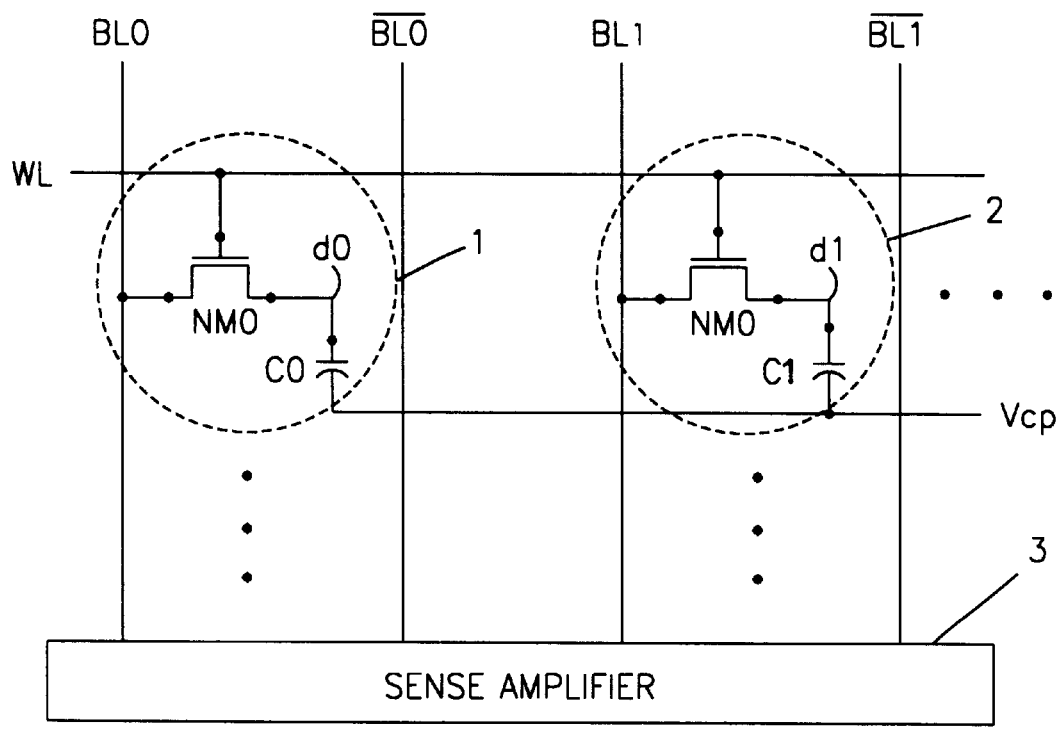
FIG. 1 is a diagram illustrating the construction of a conventional memory cell.

The construction of a memory cell according to the present invention is identical with that of the conventional memory cell, as shown in FIG. 1.

First, a high and low level data are stored in cell capacitors C0 and C1, respectively, and a cell plate voltage Vcp is inputted thereto as a predetermined voltage V1 at the early stage.

Figure 3A:
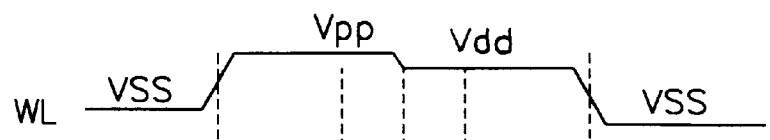
FIGS. 3A–3F are timing diagrams illustrating an input and output of each unit which is applied to a memory cell according to the present invention in FIG. 1.

Next, as shown in FIG. 3A, when a word line WL is enabled at a time t1 and NMOS transistors NM0 and NM1 of memory cells 1 and 2 are turned on, a voltage difference is each formed between bit lines BL0 and /BL0, and the bit lines BL1 and /BL1, and the voltage difference is amplified by a sense amplifier 3, thus the high and low level data become Vdd and Vss, respectively.

Figure 3B:
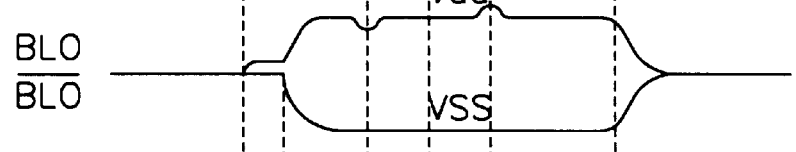
Figure 3C:
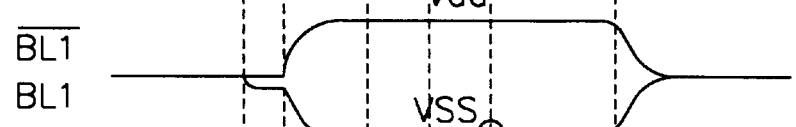

Accordingly, as shown in FIGS. 3B and 3C, the bit lines BL0 and BL1 become Vdd and Vss, respectively, by the sensing operation of the sense amplifier 3 and, as shown in FIGS. 2E and 2F, electrodes d0 and d1 of the cell capacitors C0 and C1 become Vdd and Vss, respectively, in accordance with the NMOS transistors NM0 and NM1 which are turned on.

Figure 3D:
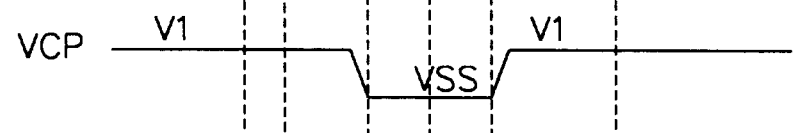

Next, when the bit lines BL0 and BL1 completely become Vdd and Vss, respectively, as shown in FIG. 3D, the cell plate voltage Vcp becomes Vss at a time t2, and a word line voltage of VPP(Vdd+Vth) becomes Vdd at a time t2'. Here, the voltage levels of the bit lines BL0 and BL1 drop for a certain time by the cell capacitors C0 and C1, affected by the cell plate voltage Vcp, and again return to the previous voltage level.

Therefore, since the electrode d0 of the cell capacitor C0 is Vdd, the NMOS transistor NM0 becomes tuned off and the NMOS transistor NM1 maintains a turn-on state.

Figure 3E:
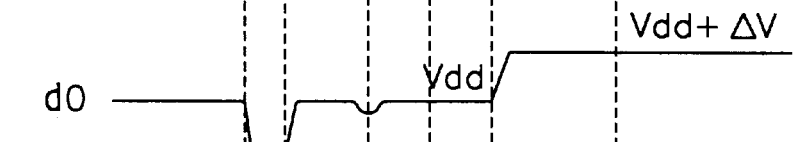
Figure 3F:
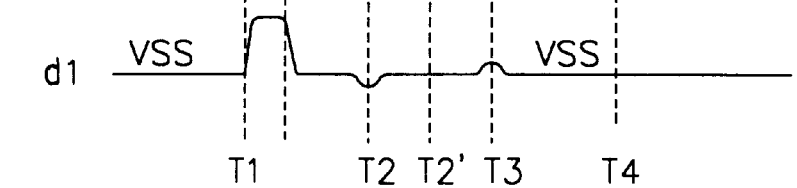

When the cell plate voltage Vcp is again raised at the level V1 at a time t3, as shown in FIG. 3E, the electrode d0 of the cell capacitor C0 becomes Vdd+$\Delta$V, and each voltage level of the bit lines BL0 and BL1 is raised for a certain time and then shortly returns to the previous voltage level.

And, when the word line WL is disabled, the NMOS transistors NM0 and NM1 are all turned off, thus the electrode d0 of the cell capacitor C0 becomes Vdd+$\Delta$V and the electrode d1 of the cell capacitor C1 becomes Vss.

Accordingly, the high level data of the cell capacitor C0 maintains Vdd+$\Delta$V which has been raised an additional amount $\Delta$V above Vdd, thereby being able to resist leakage and lengthen a storing time of a cell data.

As described above, the method for controlling the semiconductor memory device according to the present invention is capable of extending a refresh interval, lengthening a storing time of a cell data, and reducing power consumption, by raising a high level data stored in the cell capacitor above Vdd.

Although the preferred embodiment of the present invention has been disclosed for illustrative purposes, those skilled in the art will appreciate that various modifications, additions and substitutions are possible, without departing from the scope and spirit of the invention as recited in the accompanying claims.

What is claimed is:

1. In a memory cell construction comprising a plurality of memory cells each having an NMOS transistor provided with a gate and a drain which are connected to a word line and a bit line, respectively, and a cell capacitor of which an electrode is connected to a source of the NMOS transistor and the other electrode is connected to an input terminal of a cell plate voltage, and a sense amplifier connected to a pair of bit lines for amplifying a datum, a method for controlling a memory cell, the method comprising:

maintaining a voltage of the cell capacitor at a Vdd level that is the same as a voltage level on the bit line, in accordance with a word line signal of a Vpp level and the cell plate voltage of V1 during a first interval;

maintaining the voltage of the cell capacitor at a Vdd level in accordance with the cell plate voltage of a Vss level and a word line signal of a Vdd level during a second interval; and raising the voltage of the cell capacitor up to Vdd+$\Delta$V in accordance with the word line signal of the Vdd level and the cell plate voltage of V1 during a third interval.

2. The method of claim 1, wherein the cell plate voltage drops from V1 to Vss before the word line signal level drops from VPP to Vdd.

3. In a memory having a plurality of memory cells, each cell having an NMOS transistor the gate and drain of which are connected to a word line and a bit line, respectively, and a cell capacitor of which one electrode is connected to a source of said NMOS transistor and the other electrode is connected to an input terminal of a cell plate voltage source, and a sense amplifier connected to a pair of bit lines for amplifying a datum, a method for controlling operation of a memory cell, the method comprising:

setting, during a first interval, said word line to a first high state and said cell plate voltage source to a second high state;

establishing, during said first interval, a voltage of said cell capacitor at a first high level according to said first high state of said word line and said second high state of said cell plate voltage source;

keeping, during a second interval, said word line at said first high state and setting said cell plate voltage source to a low state;

maintaining, during said second interval, said voltage of said cell capacitor at said first high level according to said high state of said word line and said low state of said cell plate voltage source;

keeping, during a third interval, said word line at said first high state and resetting said cell plate voltage source to said second high state; and raising, during said second interval, said voltage of said cell capacitor to a second high level greater than said first high level according to said first high state of said word line and said second high state of said cell plate voltage source.

4. The method of claim 3, wherein said high state of said word line has a first substate of a voltage Vpp and a second substate of a voltage Vdd, where Vpp>Vdd, said word line being set to Vpp during said first interval, said word line being changed from Vpp to Vdd during said second interval and said word line being maintained at Vdd during said third interval.

5. The method of claim 4, wherein, during said second interval, said cell plate voltage source drops from said second high state to said low state before said word line is changed from Vpp to Vdd.

6. The method of claim 3, wherein said second high state of said cell plate voltage source is V1 and said low state of said cell plate voltage source is Vss.

* * * * *

UNITED STATES PATENT AND TRADEMARK OFFICE
CERTIFICATE OF CORRECTION

PATENT NO. : 6,166,945
DATED : December 26, 2000
INVENTOR(S) : Kyun-Kyu Choi et al.

It is certified that error appears in the above-identified patent and that said Letters Patent is hereby corrected as shown below:

Title page, item [73],
Should read as follows:

-- [73] Assignee: Hyundai Electronics Industries Co., Ltd.,
 Kyoungki-do, Korea --.

Signed and Sealed this

Second Day of October, 2001

Attest:

*Nicholas P. Godici*

NICHOLAS P. GODICI
*Acting Director of the United States Patent and Trademark Office*

*Attesting Officer*